Figure 1:
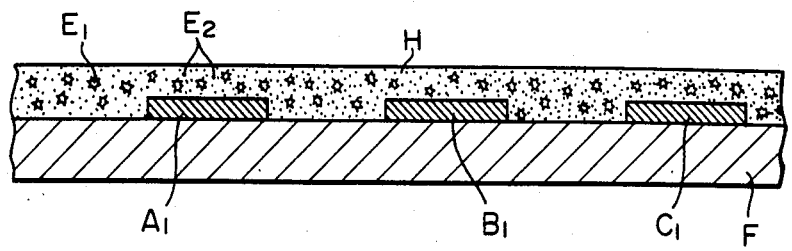

United States Patent [19]

Yamazaki

[11] Patent Number: 4,696,764

[45] Date of Patent: Sep. 29, 1987

[54] ELECTRICALLY CONDUCTIVE ADHESIVE COMPOSITION

[75] Inventor: Taro Yamazaki, Yokohama, Japan

[73] Assignee: Osaka Soda Co., Ltd., Osaka, Japan

[21] Appl. No.: 676,876

[22] Filed: Nov. 30, 1984

[30] Foreign Application Priority Data

Dec. 2, 1983 [JP] Japan .................................. 58-227057
Sep. 17, 1984 [JP] Japan .................................. 59-195139

[51] Int. Cl.$^4$ ............................................. H01B 1/04
[52] U.S. Cl. .................................... 252/503; 252/504; 252/506; 252/511; 252/512; 252/513; 252/514; 252/516; 252/518; 252/519; 252/520; 524/439; 524/401; 106/1.12; 106/1.22
[58] Field of Search ............... 252/502, 503, 506, 511, 252/513, 514, 516, 520, 518, 519; 524/401, 403, 404, 413, 428, 430, 439, 440, 500; 106/1.12, 1.22, 20

[56] References Cited

U.S. PATENT DOCUMENTS

| | | | |
|---|---|---|---|
| 4,042,534 | 8/1977 | Andrianov et al. | 252/511 |
| 4,113,981 | 9/1978 | Fujita et al. | 252/511 X |
| 4,147,669 | 4/1979 | Shuheen et al. | 252/514 |
| 4,391,742 | 7/1983 | Sleigerwald et al. | 252/512 |

*Primary Examiner*—Josephine L. Barr
*Attorney, Agent, or Firm*—Sherman and Shalloway

[57] ABSTRACT

An electrically conductive adhesive composition which provides electric conductivity between facing electrodes but maintains electric insulation in the lateral direction across the facing direction, said composition comprising (a) a nonconductive base resin and (b) electrically conductive particles incorporated and dispersed in the resin (a); wherein (I) said electrically conductive particles (b) are composed of (b-1) 10 to 75%, based on the total weight of the components (a), (b-1) and (b-2), of abrasive grain-like electrically conductive particles having an average particle diameter of at least 1 micrometer, and (b-2) 0.2 to 20% by weight, based on the total weight of the components (a), (b-1) and (b-2), of electrically conductive fine particles having an average particle diameter of not more than 0.5 micrometer, and (II) said electrically conductive adhesive composition contains a solvent for said base resin (a) in an amount required to form said composition into the state of a printing ink or a paint.

10 Claims, 4 Drawing Figures

(I)

(II)

ELECTRICALLY CONDUCTIVE ADHESIVE COMPOSITION

This invention relates to an improvement in an electrically conductive adhesive composition which provides electric conductivity between facing electrodes but maintains electric insulation in the lateral direction across the facing direction (to be sometimes referred to as an "anisotropically conductive composition"). Specifically, it relates to an anisotropically conductive composition which provides improved excellent electric connection between facing electrodes accurately and stably, maintains improved excellent insulating properties accurately and stably in the lateral direction across the facing direction, and can be formed into a thin coating like a printing ink or paint, and which can provide improvements in regard to heat resistance, adhesion strength and solvent resistance.

More specifically, this invention relates to an electrically conductive adhesive composition which provides electric conductivity between facing electrodes but maintains electric insulation in the lateral direction across the facing direction, said composition comprising (a) a nonconductive base resin and (b) electrically conductive particles incorporated and dispersed in the resin (a); characterized in that
(I) said electrically conductive particles (b) are composed of
  (b-1) 10 to 75%, based on the total weight of the components (a), (b-1) and (b-2), of abrasive grain-like electrically conductive particles having an average particle diameter of at least 1 micrometer, and
  (b-2) 0.2 to 20% by weight, based on the total weight of the components (a), (b-1) and (b-2), of electrically conductive fine particles having an average particle diameter of not more than 0.5 micrometer, and
(II) said electrically conductive adhesive composition contains a solvent for said base resin (a) in an amount required to form said composition into the state of a printing ink or a paint.

Anisotropically conductive compositions have been developed which can be used as connectors, for example in connecting circuits of a printed circuit with each other or the detecting section of a printed circuit with a control section. The composition of this invention is useful in such an application.

In recent years, connectors used for connecting parts relating to printed circuits have been reduced in size and the number of terminals has increased. For this reason, it has become impossible to connect such parts by soldering or caulking, and these connecting methods have been superseded by methods involving the use of various special connectors such as a connector composed of a gold-plated stainless wire embedded in silicone rubber, a connector composed of a number of bent pipe-like printed conductors laid parallel to each other, and a connector composed of an anisotropically conductive pressure-sensitive rubber sheet. The anisotropically conductive pressure-sensitive rubber sheet contains a certain amount of conductive fine particles, and attracts much interest as a connector for connecting two circuits having parallel conductors like printed circuits to provide conductivity in the thickness direction and maintains insulation in a direction at right angles to the thickness direction.

A conventional connector of this type is produced by mixing a plastic material with a metal powder having a certain particle size (about 1 micrometer), and molding the mixture by a roll to form a sheet. It is interposed between two facing electrodes and press-bonded to the electrodes. Because there is a limit to the thickness of a sheet which can be molded by a roll and to the electrical conductivity by the amount of the mixed metal powder, the desired performance cannot be expected if the sheet has a thickness below a certain limit. Accordingly, it has been desired to develop a paint-type connector that can be coated in a very small thickness.

Such a paint-type connector is disclosed, for exaple, in Japanese Patent Publication No. 2179/1984. The technique disclosed in this patent document uses electrically conductive fine particles having a normal spherical shape. Even when a composition containing such particles is interposed under pressure between electrical component parts, effective conductivity anisotropy cannot be maintained between them.

As stated above, the electrically conductive adhesive composition which provides electric conductivity between facing electrodes but maintains electric insulation in the lateral direction across the facing direction and which comprises (a) a nonconductive base resin and (b) electrically conductive particles incorporated and dispersed in the base resin (a) is generally known. It is also known to use two kinds of electrically conductive particles having different particle sizes in such an anisotropically conductive composition.

Figure 3:
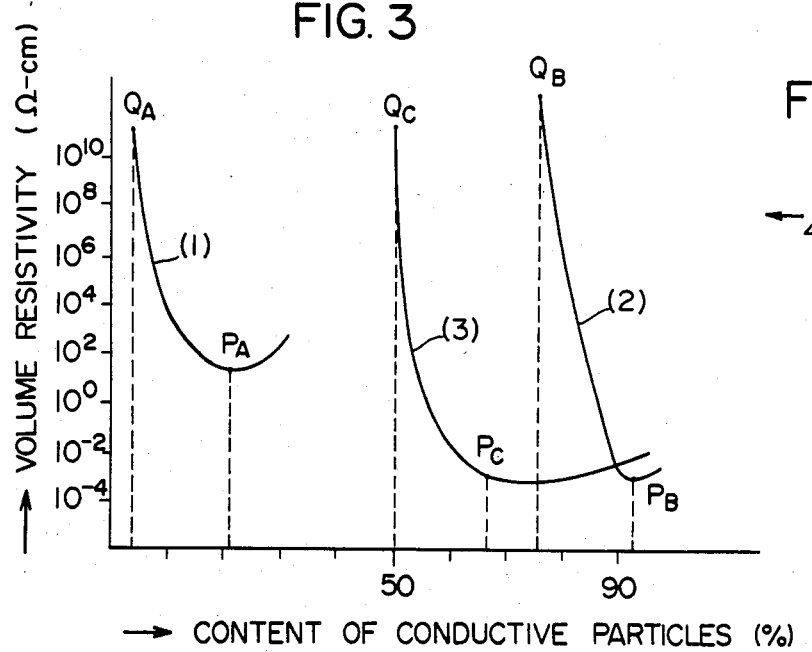

For example, U.S. Pat. No. 4,113,981 discloses an anisotropically conductive composition and an assembly using this composition. It describes an anisotropically conductive composition comprising a nonconductive base resin and electrically conductive particles incorporated in the base resin. The patent exemplifies carbon powder, SiC powder and powders of metals such as reduced Ag, Au, Pd/Ag, Ni and In as the conductive particles, and states that the conductive particles preferably have substantially the same spherical shape and diameter. The U.S. patent further states that in order to improve the electric conductivity between facing members or the insulating property in the lateral direction, insulating particles or electrically conductive fine particles having a scale-like shape may be incorporated in the nonconductive base together with the above-mentioned conductive particles. FIG. 3 of this patent shows an embodiment in which the electrically conductive fine particles having a scale-like shape are used in combination with the electrically conductive particles preferably having substantially the same spherical shape and diameter. Furthermore, the U.S. patent describes a hot-melt adhesive or a thermoplastic resin as the base resin. The U.S. patent, however, totally fails to describe or suggest the use of the electrically conductive particles (b-1) in the form of abrasive grains which are non-spherical in shape and the combination of these abrasive grain-like electrically conductive particles and the electrically conductive fine particles (b-2) having a smaller particle size as in the present invention. On the contrary, the U.S. patent recommends the use of electrically conductive particles in a spherical shape which is inconsistent with the abrasive grain-like form in the present invention. Moreover, the cited U.S. patent neither suggests the use of the solvent specified in (II) above and an idea of providing a composition in the state of a printing ink or a paint.

Furthermore, the conventional anisotropically conductive composition is desired to be further improved in the electric conductivity between facing electrodes and the electric insulating properties in the lateral direction. However, an attempt to increase the electric conductivity between eletrodes tends to result in adverse effects on the electric insulating in the lateral direction. In addition, with the conventional anisotropically conductive composition, the electric conductivity and electric insulation cannot be maintained fully accurately and stably.

The present inventor has made investigations in order to develop an improved anisotropically conductive composition which can overcome the aforesaid technical problems of the conventional anisotropically conductive composition. These investigations have led to the discovery that the use of electrically conductive particles composed of a combination of (b-1) a specified amount of "abrasive grain-like" electrically conductive particles having an average particle diameter of at least 1 micrometer and (b-2) a specified amount of electrically conductive fine particles having an average particle diameter of not more than 0.5 micrometer improves the aforesaid electrical conductivity in the facing direction and the electrical insulation properties in the lateral direction and makes it possible to maintain them more accurately and stably than in the prior art.

The investigations of the present inventor have shown that by further incorporating a solvent for the nonconductive base resin, the resulting composition can be applied easily and conveniently in the same form as a printing ink or a paint to various objects in a wide range of uses, and that the thin coated film of the composition so applied exhibits the aforesaid improved properties. It has further been found that a thermosetting resin soluble in the aforesaid solvent or a blend of it with a thermoplastic resin soluble in the solvent can be used as the nonconductive base resin, and thus a further improvement can be achieved in heat resistance, adhesion strength and solvent resistance.

It is an object of this invention therefore to provide an improved electrically conductive adhesive composition having anisotropic electric conductivity.

The above and other objects and advantages of this invention will become more apparent from the following description.

In the anisotropically conductive composition of this invention comprising (a) a nonconductive base resin and (b) electrically conductive particles incorporated and dispersed in the base resin (a), the electrically conductive particles (b) are composed of (b-1) 10 to 75%, based on the total weight of the components (a), (b-1) and (b-2), of abrasive grain-like electrically conductive particles having an average particle diameter of at least 1 micrometer, and (b-2) 0.2 to 20% by weight, based on the total weight of the components (a), (b-1) and (b-2), of electrically conductive fine particles having an average particle diameter of not more than 0.5 micrometer.

The amount of the base resin (a) in the composition of this invention is therefore the balance (% by weight) obtained by subtracting the total percentage of (b-1) and (b-2) from 100.

In the present invention, it is essential that the electrically conductive particles (b-1) should have an average particle diameter of at least 1 micrometer and be in the form of abrasive grains. The words "abrasive grain-like" or the phase "in the form of abrasive grains", as used in the present specification and the appended claims, means non-spherical particles like "abrasive grains" which have a surface shape containing many projections, projecting edges and the like, for example coarse particles having the shape of a polyhedron, and exclude ordinary particles having a smooth or nearly smooth spherical surface.

Such abrasive grain-like electrically conductive particles themselves are known and commercially available, and can be used in this invention. For example, these particles are made of electrically conductive metals, metal alloys or metal compounds. Preferred particles (b-1) are abrasive grain-like electrically conductive particles of a material selected from metals, metal alloys, metal carbides, metal nitrides and metal borides, and particles obtained by plating the surface of such particles or abrasive grain-like metal oxide particles with a highly electrically conductive metal material.

Specific examples of the particles (b-1) are abrasive grain-like electrically conductive metal particles such as nickel, cobalt or iron particles made by the carbonyl method; abrasive grain-like electrically conductive metal alloy particles such as alloys of the aforesaid metals made by an atomizing method and a stamp method; abrasive grain-like electrically conductive metal compound particles, for example, particles of metal carbides such as tungsten carbide (WC), silicon carbide (SiC), titanium carbide (TiC) and thallium carbide (TlC), metal nitrides such as silicon nitride ($Si_3N_4$), titanium nitride (TiN), vanadium nitride (VN) and zirconium nitride (ZrN) and metal borides such as thallium boride (TlB), zirconium boride (ZrB) and titanium boride (TiB); and plated abrasive grain-like electrically conductive particles obtained by plating the surfaces of these abrasive grain-like electrically conductive metal particles metal alloy particles and metal compound particles or abrasive grain-like particles of metal oxides such as $Al_2O_3$ and $SiO_2$ with highly electrically conductive metal materials such as nickel, copper, silver, gold, platinum, rhodium, ruthenium, osmium and palladium. Such surface plating can be carried out by known means such as chemical vapor deposition, physical vapor deposition and electroless plating. The electroless plating method is preferred.

The particles (b-1) used in this invention have an average particle diameter of at least 1 micrometer, for example 1 to 100 micrometers, preferably 1 to 80 micrometers, especially preferably 1 to 50 micrometers. The electric conductivity of the particles (b-1) is expressed, for example, by an inherent electric resistance at room temprature of not more than 100 ohms-cm, for example $10^{-5}$ to 100 ohms-cm. When the abrasive grain-like particles (b-1) have an excessively large particle size the electric resistance between facing electrodes and variations with time can be decreased, but the electrodes have poor adaptability to printing by the composition of this invention. Accordingly, the particle size of the abrasive grain-like particles (b-1) is peferably selected within the above-exemplified range in consideration of the effect of using them in combination with the particles (b-2). Specific particle sizes may be selected depending upon the electric conductivity and amount of the fine particles (b-2), the distance between circuits, the thickness of a coating of the anisotropically conductive composition, its adhesion strength, the resistance between facing electrodes, the resistance between adjacent electrodes, the method of forming the electrically conductive coating, the method of heat-bonding, etc.

The abrasive grain-like electrically conductive particles having an average particle diameter of at least 1 micrometer (b-1) can be properly selected in accordance with the foregoing description. Several examples of the particles (b-1) which are commercially available are tabulated below.

| Chemical name | Trade name Manufacturer | Particle diameter (microns) |
| --- | --- | --- |
| Nickel | #255 NICKEL (The International Nickel Co.) | 2–25 |
| Nickel | #287 NICKEL (The International Nickel Co.) | 4–40 |
| Nickel alloy | FUKUDALLOY (Fukuda Metal Co.) | 7–50 |
| Graphite | MARCONITE (Marconite Co.) | 15–60 |
| Gold-plated SiC | Au—SiC (Mitsui Metal Co., Ltd.) | 20–75 |

The amount of the abrasive grain-like electrically conductive particles (b-1) used in this invention is 10 to 75% by weight based on the total weight of the components (a), (b-1) and (b-2). If it is less than 10% by weight, the adhesion strength of the resulting composition is improved but undesirably has a high electric resistance, and moreover, variations in the electric resistance value become great. On the other hand, if it exceeds 75% by weight, the adhesion strength is low and a practical coated film of the composition is difficult to obtain.

The electrically conductive fine particles (b-2) should have an average particle diameter of not more than 0.5 micrometer. There is no particular restriction on their shape, but usually, they are in a normal spherical shape.

These conductive fine particles themselves are known and available commercially and can be used in this invention. Examples of such particles are particles of carbon black, graphite, highly electrically conductive colloidal metals or metal alloys.

A fine powder of carbon black or graphite having an average particle diameter of not more than 0.5 micrometer may be most commonly used. There can also be used powders of colloidal highly electrically conductive metals or metal alloys such as colloidal gold, platinum, rhodium, ruthenium, palladium, iridum and colloidal titanium.

The average particle diameter of the particles (b-2) should be not more than 0.5 micrometer. Its lower limit is not particularly set up, but usually particle diameters in the range of $10^{-4}$ to 0.5 micrometer may be used. The electric conductivity of the particles (b-2) is expressed, for examples, by an inherent electric resistance (at room temperature) of not more than 1 ohm-cm, preferably not more than 0.1 ohm-cm.

The electrically conductive fine particles (b-2) having an average particle diameter of not more than 0.5 micrometer can be properly selected in accordance with the foregoing description. Such particles (b-2) are also commercially available, and can be used in this invention. Several examples of such particles (b-2) and their inherent electric resistances at room temperature in a base resin are tabulated below.

| Chemical name | Trade name | Manufacturer | Content (%) (*) | Volume resistivity (ohm-cm) |
| --- | --- | --- | --- | --- |
| Carbon black | Ketjen Black EC | Lion Akzo Co. | 5–8 | $1.5 \times 10^{-1}$ |
| Carbon black | Denka Black | TDK Co. | 20–25 | $1.5 \times 10^{-1}$ |
| Ni—Co | Colloid Ni—Co | Nippon Shinku Yakin Co. | 60–65 | $3 \times 10^{-3}$ |
| Gold | Colloid Au | Nippon Shinku Yakin Co. | 70–80 | $6 \times 10^{-4}$ |
| Tin oxide | Tin oxide | Mitsui Kinzoku Co. | 70–80 | $1.2 \times 10^{-1}$ |
| Colloidal titanium | Black Titan | Mitsui Kinzoku Co. | 60–70 | $6 \times 10^{-1}$ |

(*): Content of the electrically conductive fine particles in the base resin (a).

In the present invention, the amount of the electrically conductive fine particles (b-2) is 0.2 to 20% by weight, preferably 1 to 15% by weight, based on the total weight of the components (a), (b-1) and (b-2). If it is less than 0.2% by weight, the electric conductivity in the facing diection of electrodes is insufficient. If it exceeds 20% by weight, the electric insulation in the lateral direction across the facing direction is reduced. Furthermore, the adhesion strength of a coating of the resulting composition is reduced, and its electric resistance becomes high. Moreover, the resistance value varies.

In the present invention, the ratio between the abrasive grain-like particles (b-1) and the fine particles (b-2) used can be properly chosen. To achieve the improvement contemplated by this invention to a satisfactory degree, the weight ratio of the abrasive grain-like particles (b-1) to the fine particles (b-2), (b-1):(b-2), is from 100:1 to 100:70, preferably from 100:3 to 100:45.

In the anisotropically conductive composition of this invention, it is essential to use the electrically conductive particles (b) composed of a combination of the abrasive grain-like electrically conductive particles (b-1) and the electrically conductive fine particles (b-2). It is presumed that the abrasive grain-like particles (b-1) serve to ensure electrical connection between facing electrodes and maintain it stably. The fine particles (b-2) are believed to come into the spaces among the abrasive grain-like particles (b-1) and serve to aid in the full exhibition of an electrically connecting effect between facing electrodes by the particles (b-1) and maintain this state stably. Furthermore, the abrasive grain-like particles (b-1) have a great anchoring effect on the base resin (a) and electrodes such as in printed circuits owing to their abrasive grain-like shape. Since after connecting facing electrodes through the composition of this invention, it is not likely to be dislocated undesirably, and therefore, the initial connection is kept and the electric insulation properties are accurately and stably maintained in the lateral direction across the facing direction.

In the anisotropically conductive composition of this invention, the nonconductive base resin (a) in which the electrically conductive particles (b) are to be incorporated and dispersed may, for example, be a hot-melt adhesive or a thermoplastic resin soluble in a solvent which is included in the composition to cause the composition to assume the state of a printing ink or a paint, or a combination of such a resin with a hot-melt adhesive or a thermoplastic resin insoluble in the above solvent.

Another example of the nonconductive base resin (a) is a thermosetting resin soluble in the solvent or a blend of the thermosetting resin and a thermoplastic resin soluble in the solvent. These solvent-soluble resins may be used in combination with a powder of a hot-melt adhesive or thermoplastic resin insoluble in the solvent.

According to one embodiment of the composition of this invention, the nonconductive base resin (a) is composed of (a-1) 10 to 50% by weight, based on the total weight of the components (a), (b-1) and (b-2), of a hot-melt adhesive or thermoplastic resin soluble in the aforesaid solvent and (a-2) 0 to 70% by weight, on the same basis as above, of a powder of a hot-melt adhesive or thermoplastic resin insoluble in the aforesaid solvent.

Specific examples of the solvent-soluble hot-melt adhesive or thermoplastic resin (a-1) used in this embodiment are mixtures of ethylene copolymers, polyamides, polyesters, polyurethane or polypropylene as a base and rosin derivative, terpene resins or petroleum resin as a tackifier. Such solvent-soluble hot-melt adhesives or thermoplastic resins (a-1) or their constituents are available commercially and can be used in this invention. Examples of the resin (a-1) are tabulated below.

| Resin | Trade name | Manufacturer | Solids content (%) |
|---|---|---|---|
| Base (main component) | | | |
| Ethylene/vinyl acetate copolymer | Evaflex V575 | Mitsui Poly-Chemical Co., Ltd. | 25 |
| Thermoplastic polyester | Vylon 300 | Toyobo Co., Ltd. | 30 |
| Thermoplastic polyester | Stafix-LC | Fuji Film Co., Ltd. | 30 |
| Tackifier | | | |
| Rosin ester | Rosin WW | Arakawa Chemical Co., Ltd. | 50 |
| Petroleum resin | Nisseki Neopolymer 120 | Nippon Petrochemical Co. | 40 |

The solvent capable of dissolving the solvent-soluble hot-melt adhesive or thermoplastic resin (a-1) may preferably be a solvent having a boiling point of at least 150° C. and a relatively low vapor pressure which can be used in screen printing. Cyclohexanone may be cited as an example of the solvent for Evaflex V575 given in the above table. Acetic acid carbitol is another example of the solvent for the other resins.

In the above embodiment, the amount of the solvent-soluble hot-melt adhesive or thermoplastic resin (a-1) is preferably 10 to 50% by weight based on the total weight of the components (a), (b-1) and (b-2). If it is excessively small outside this range, it is difficult to obtain a suitable electric insulating effect attributed to the nonconductive base resin, and the electric conductivity between facing electrodes is likely to be reduced.

The powdery hot-melt adhesive or thermoplastic resin insoluble in the solvent (a-2) in the above embodiment may be a hot-melt adhesive or thermoplastic resin insoluble in the solvent for the resin (a-1), specifically nylon 12 (trade name T450P-1, a product of Daicel Chemical Co., Ltd.). Preferably the resin (a-2) is used in an amount of 0 to 70% by weight based on the total weight of the components (a), (b-1) and (b-2). In the case of the anisotropically conductive composition of this invention which is of the screen printing ink type, it is preferred to incorporate a relatively large amount of the electrically conductive particles (b-1) having a particle diameter of at least 10 micrometers from the standpoint of the printing adaptability of the composition. The increase of the amount of such particles, however, reduces the adhesion strength of the composition. The solvent insoluble hot-melt resin (a-2) has the advantage of playing the role of the aforesaid particles having a particle diameter of at least 10 micrometers without causing a reduction in adhesion strength. The particles of the resin (a-2) preferably has a size passable through a screen for screen printing, for example not more than 70 micrometers, especially 2 to 10 micrometers.

According to another embodiment of the anisotropically conductive composition of this invention, the nonconductive base resin (a) is composed of (a-3) 30 to 80% by weight, based on the total weight of the components (a), (b-1) and (b-2), of a thermosetting resin soluble in the aforesaid solvent or a blend of the thermosetting resin with a thermoplastic resin soluble in the aforesaid solvent and (a-4) 0 to 70% by weight, on the same basis, of a powder of a hot-melt adhesive or thermoplastic resin insoluble in the aforesaid solvent.

The thermosetting resin (a-3) used as a binder in this embodiment is preferably a thermosetting resin having a melting point of 50° to 150° C. and a gellation time at 170° C. of 1 second to 30 minutes, preferably 5 seconds to 2 minutes. Examples of such resin (a-3) are epoxy resins, unsaturated polyester resins, phenolic resins, melamine resins, thermosetting acrylic resins, diallyl phthalate resin, urethane resin and modified products of these resins which are soluble in the aforesaid solvent. These resins may be used singly or as a mixture. Furthermore, as desired, reactive monomers, curing agents, catalysts, curing accelerators, etc. may be used to cure the thermosetting resins. As required, there can be used other additives, for example tackifiers such as rosin derivatives, terpene resins and petroleum resins, solvents, solvents which can be dried to a state perceptible by finger touch at a temperature below the curing temperature of the resin, such as cyclohexane, ethyl Cellosolve, benzyl alcohol, diacetone alcohol and terpineol, flexibility imparting agents, fire retardants, and fire retardant aids.

Specific examples of the epoxy resins include those of the bisphenol A, bisphenol F, hydrogenated bisphenol A, tetrabromobisphenol A, phenol novolac, brominated phenol novolak, cresol novolak, glycydylamine, hydantoin, triglycidyl isocyanurate and alicyclic types. Examples of the curing agent for these resins include aliphatic amines such as diethylenetriamine, meta-xylylenediamine and polyamide resins; cyclic aliphatic amines such as para-methanediamine and 2-ethyl-4-methylimidazole; aromatic amines such as meta-phenylenediamine and 4,4'-diaminodiphenylmethane; acid anhydrides such as phthalic anhydride and Nadic Anhydride; tertiary amines; boron trifluoride-monoethylamine; dicyandiamide; molecular sieve curing agents; and microcapsular curing agents. Furthermore, cationically polymerizable Lewis acid catalysts can also be used.

The unsaturated polyesters may be those derived from at least one dicarboxylic acid component and at least one diol component. Examples of the dicarboxylic acid component are unsaturated dibasic acids such as maleic anhydride, fumaric acid, itaconic acid, citraconic acid, glutamic acid and mesaconic acid and saturated dibasic acids such as succinic acid, glutaric acid, adipic acid, sebacic acid, dodecanedicarboxylic acid, terephthalic acid, isophthlaic acid, orthophthalic acid, tetrahydrophthalic acid and hexahydrophthalic acid. Examples of the diol component are ethylene glycol, propylene glycol, diethylene glycol, dipropylene glycol, triethylene glycol, 1,3-butylene glycol, 2,3-butylene glycol, neopentyl glycol, hexylene glycol, octylene glycol, bisphenol A and hydrogenated bisphenol A.

Examples of the crosslinking monomer include styrene, divinyl benzene, diallyl phthalate, triallyl cyanurae, (meth)acrylic acid and alkyl esters thereof, acrylonitrile, vinyl acetate and acrylamide. Curing agents to be used for the unsaturated polyesters may be ordinary organic peroxides such as benzoyl peroxide, methyl ethyl ketone peroxide and tertiary butyl perbenzoate. As required, accelerators such as cobalt naphthenate and cobalt octylate and polymerization inhibitors such as hydroquinone may be added.

The phenolic resins may be resol resins obtained by reacting phenols and formaldehyde in the presence of alkaline catalysts or novolac resins obtained by performing the reaction in the presence of acid catalysts.

The melamine resins may, for example, be liquid or powdery resins obtained by reacting melamine with formaldehyde under heat at a pH of at least 7.

Examples of the diallyl phthalate resins are prepolymers prepared from diallyl ortho-phthalate, diallyl isophthalate and diallyl terephthalate either singly or as a mixture, and coprepolymers of the above diallyl phthalates with vinyl-type monomers or allyl-type monomers copolymerizable therewith.

The polyurethane resin may be a resin obtained by reacting a polydiisocyanate and a polyglycol or a polyester polyol having hydroxyl groups at both ends to prepare a product having isocyanate groups at both ends or more than 2 isocyanate groups, and adding a compound having at least two active hydrogens such as polyethylene glycol, a polyester having hydroxyl groups at both ends, a polyamine or a polycarboxylic acid as a crosslinking agent.

Examples of the polyisocyanate include tolylene diisocyanate, 3,3'-tolylene-4,4'-diisocyanate, diphenylmethane 4,4'-diisocyanate, triphenylmethane p,p',p''-triisocyanate, 2,4-tolylene dimer, naphthalene-1,5-diisocyanate, tris(4-phenyl isocyanate)thiophosphate, tolylene diisocyanate trimer, dicyclohexamethane 4,4'-diisocyanate, meta-xylylene diisocyanate, hexahydrometa-xylylene diisocyanate, hexamethylene diisocyanate, trimethylpropane-1-methyl-2-isocyano-4-carbamate, polymethylene polyphenyl isocyanate, and 3,3'-dimethoxy 4,4'-diphenyl diisocyanate. It is possible to add polyisocyanates to polyester polyols or polyether polyols having hydroxyl groups at both ends of the molecule.

The thermosetting acrylic resins may be those acrylic resins into which at least two carboxylic acid groups or anhydrides thereof, epoxy groups, amino groups or other polymerizable functional groups have been introduced. Curing agents suitable for the functional groups may be added, and the acrylic resins may be cured under heat.

When the anisotropically conductive composition of this invention is utilized for connecting flexible terminals in the above embodiment of using the thermosetting resin (a-3) soluble in the solvent mentioned in the requirement (II) of the present invention, the sole use of the resin (a-3) may not give satisfactory adhesion strength. Furthermore, it is sometimes desired to improve the impact strength, flexural strength and initial adhesion strength of the thermosetting resin. In such a case, the blend of the thermosetting resin and a thermoplastic resin (including an elastomer) soluble in the solvent can be utilized as the resin (a-3). Examples of such a blend include a blend of a phenolic resin and a polyvinyl acetal resin, a blend of a phenolic resin and synthetic rubber, a blend of an epoxy resin and a polyamide, a blend of an epoxy resin and nitrile rubber and a blend of an epoxy resin and polybutadiene.

The amount of the resin (a-3), i.e. the thermosetting resin or the blend of it with the thermoplastic resin, is preferably 30 to 80% by weight based on the total weight of the components (a), (b-1) and (b-2).

The hot-melt adhesive or thermoplastic resin powder (a-4) insoluble in the solvent may be those insoluble in the solvents for the resin (a-3). Examples are nylon 12, saturated polyesters (for example, Vylon GM-900, a trade name for a product of Toyobo Ltd.), epoxy resins (for example, TEPIC, a trade name for a product of Nissan Chemical Co., Ltd. and polyurethane resins (for example, Yuro Polymer 200, a trade name for a product of Nomura Office). Preferably, the resin (a-4) is used in an amount of 0 to 70% by weight based on the total weight of the components (a), (b-1) and (b-2) for the reason set forth above with regard to the resin (a-2). The preferred particle size of the resin (a-4) is also the same as described above with regard to the resin (a-2).

The anisotropically conductive composition of this invention can be prepared by mixing the electrically conductive particles composed of the abrasive grain-like electrically conductive particles (b-1) and the electrically conductive fine particles (b-2), the nonconductive base resin such as (a-1) and (a-2) or (a-3) and (a-4) and a solvent capable of forming a printing ink or paint from the composition by mixing means known per se so that the electrically conductive particles (b) are uniformly dispersed in the resin (a). The mixing means include, for example, a roll mill and a ball mill.

The anisotropically conductive composition of this invention contains a solvent for the nonconductive base resin (a) in an amount required to form said composition into the state of a printing ink or a paint. The solvent may be selected properly from known solvents depending upon the type of the resin (a) used. As required, it can be easily selected by performing a preliminary experiment. Examples of the solvent include acetic acid carbitol, cyclohexanone, ethyl Cellosolve, Cellosolve acetate, diacetone alcohol and xylene.

These solvents may be used singly or in combination. The amount of the solvent may be any which can form the composition into the state of a printing ink or a paint. For example, it is about 5 to about 70% by weight, preferably about 8 to about 50% by weight, based on the weight of the resin (a).

The anisotropically conductive composition of this invention may be used to provide electric connection between facing electrodes, for example between circuits in a printed circuit, or between the detection section of a printed circuit and a control section.

Figure 2:
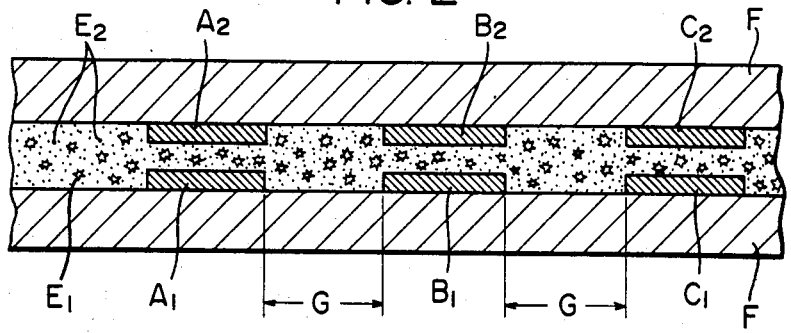

FIGS. 1 and 2 are cross sectional views showing the application of the composition of this invention to conductors in a printed circuit. Let us assume that parallel conductors $A_1$, $B_1$ and $C_1$ exist on the surface of an insulation film F. When the composition of this invention is printed on them by screen printing, the electrically conductive fine particles $E_2$ (b-2) exist among the abrasive grain-like electrically conductive particles $E_1$, and these particles are coated with the nonconductive base resin H (a) as a binder. When a similar substrate composed of an insulation film F and parallel conductors $A_2$, $B_2$ and $C_2$ provided thereon is laid over the above film so that the parallel conductors face each other, the composition of this invention provides electric conductivity between $A_1$ and $A_2$, between $B_1$ and $B_2$ and between $C_1$ and $C_2$ but electric insulation between $A_1$ and $B_1$ and between $B_1$ and $C_1$ or between $A_2$ and $B_2$ and between $B_2$ and $C_2$, thus showing anisotropic conductivity.

In the present invention, the electric conductivity in the thickness direction (facing direction) of the coated film and the electric insulation in the plane direction (lateral direction) of the coated film do not vary but can be maintained constant by using the combination of the abrasive grain-like particles (b-1) and the fine particles (b-2). In order for the coated film to exhibit electric conductivity, the conductive particles should contact each other. When the conductive particles (b-2) having a particle diameter of not more than 0.5 micrometer are used alone in a large amount as in the prior art, the range of the content of such fine particles which can provide insulation between adjacent circuits but electric conductivity between facing circuits is narrow. On the other hand, when the abrasive grain-like conductive particles (b-1) having a particle diameter of at least 1.0 micrometer are used alone, insulation or even one site between two adjoining particles will result in great variations in resistance value. In contrast, when the abrasive grain-like particles (b-1) and the fine particles (b-2) are used in combination in accordance with this invention, the fine electrically conductive particles (b-2) occupy the spaces among the abrasive grain-like conductive particles (b-1) and the individual particles can be electrically connected accurately and stably. As a result, the electrical properties of the composition do not vary but are stabilized. This effect is promoted by the full and accurate contact of the composition with electrodes and the high anchoring effect of the abrasive grain-like particles (b-1) on the base resin (a) and the electrodes, which are described hereinabove.

When the thermosetting resin or a blend of it with the thermoplastic resin (a-3) is used, the electrically conductive fine particles (b-2) having a particle diameter of not more than 0.5 micrometer and the abrasive grain-like electrically conductive particles having a particle diameter of at least 1.0 micrometer are insulated in the lateral direction by the thermosetting resin being cured during heat bonding, and the electrically conductive particles provide electric conduction between facing electrodes. Since in this case, the abrasive grain-like electrically conductive particles (b-1) have a number of raised and depressed portions on their surface, they are difficult of moving between electrodes $A_1$ and $A_2$, between $B_1$ and $B_2$ and between $C_1$ and $C_2$, and mainly the resin component is extruded and flows into the sections G having a larger space. Consequently, the amount of the resin in these sections increases, and the composition provides electric conductivity between $A_1$ and $A_2$, between $B_1$ and $B_2$ and between $C_1$ and $C_2$, and insulation between $A_1$ and $B_1$ and between $B_1$ and $C_1$ and also between $A_2$ and $B_2$ and between $B_2$ and $C_2$, thus showing anisotropic conductivity. The abrasive grain-like particles (b-1) serve to prevent dislocation when the resin is melted and exhibits flowability at the time of heat bonding.

FIG. 3 is a graph showing the relation between the content of the electrically conductive particles and the volume resistivity value. The solid lines show the relation between two facing conductors shown in FIG. 2.

The solid line (1) shows the case of incorporating only carbon black having a particle diameter of not more than 0.5 micrometer as the fine particles (b-2). The solid line (2) shows the case of incorporating only abrasive grain-like conductive particles having a particle diameter of at least 1 micrometer (b-1). The solid line (3) shows the case of incorporating both the carbon black and the abrasive grain-like particles in a ratio of 5:95 (an example of the present invention). The points $Q_A$, $Q_B$ and $Q_C$ indicate the contents which do not provide electric conductivity by contact resistance or the Hall effect before heat bonding. At the time of heat bonding, the adjacent conductors, A, B, C ... are insulated from each other in the thickness directions $A_1A_2$, $B_1B_2$, $C_1C_2$ ..., until the contents become $P_A$, $P_B$, $P_C$ which provide electric conductivity. In the case of FIG. 3, the electric insulation is provided by increasing the resistance values between A, B, C .... Therefore, when the point $Q_A$ or $A_B$ is shifted to the left in the figure (namely, when the content of the particles is decreased), the point $P_A$ or $P_B$ cannot be maintained in a charged area during heat bonding. On the other hand, if the point $Q_A$ or $Q_B$ is shifted to the right in the figure (namely when the content of the particles is increased), the insulation between A, B, C ... cannot be fully maintained. In other words, the range of the contents which satisfy both the conductivity and insulation requirements is narrow, and even a slight difference in the production conditions will adversely affect these properties.

Thus, the electrically conductive particles (b-1) and (b-2) shown in the lines (2) and (1) respectively in FIG. 3 are combined, and the relation in this case is given by the solid line (3) in FIG. 3. The content of the electrically conductive fine particles (b-2) constituting the graph (1) of FIG. 3 is set at the point $Q_A$ which provides insulation between adjacent conductors. Since the content $Q_B$ of the abrasive grain-like conductive particles (b-1) which provides insulation between adjacent conductors in the graph (2) in FIG. 3 varies, it is set at a right value by experiments.

The point $Q_C$ is presumed from the composition of $Q_A$ and $Q_B$. The state of the cut section of the anisotropically conductive composition as a connector at the point $Q_C$ is as shown in FIG. 1, and sufficient insulation is maintained between adjacent conductors. When two connectors are aligned in position and heat-bonded as in FIG. 2, the resin flows into the sections G of FIG. 2 during heat bonding. Thus, as shown in FIG. 3, the content of the conductive particles and the resistivity between $A_1$ and $A_2$, between $B_1$ and $B_2$ and between $C_1$ and $C_2$ shift to the point $P_C$ from the point $Q_C$, and this point necessarily comes within an electrically conductive area. Accordingly, sufficient insulation, for example at least $10^{10}$ ohms, is maintained in the lateral direction A, B, C ... and the resistance between $A_1$ and $A_2$, between $B_1$ and $B_2$, between $C_1$ and $C_2$... becomes, for example, 0.5-1.5 ohms/0.1×4 mm². When adhesiveness and anisotropic conductivity are considered, the composition balance of the conductive particles, the resin and the solvent may sometimes be unsuitable for an ink or paint depending upon the selection of the resin. Hence, the composition should prferably be determined by a preliminary experiment. Generally, when the amount of the conductive particles is made small to improve adhesion, the composition lacks thixotropic property and becomes a viscous, easily foamable ink or paint. Such a composition extends to give a film that is susceptible to pinhole formation. In such a case, it is preferred to use a powdery thermosetting or thermoplastic resin insoluble in the solvent in place of part of the electrically conductive particles. This powdery resin does not dissolve in the solvent, and acts as a pigment during drying of a printed film and surface stickiness can be avoided. It is melted at the time of heat bonding to improve adhesion.

While the embodiment of using the base resin (a) containing the thermoplastic resin or the mixture of it (a-3) has been described, it should be understood that the same description as above is applicable to the case of using the hot-melt adhesive or thermosplastic resin (a-1) except that the type of the resin differs. The embodiment of using the resin (a-3) or a resin containing it is preferred. In this preferred embodiment, the anisotropically conductive composition of this invention can be used either as a two-package type in which a curing agent and a catalyst are added immediately before use or a one-package type containing a latent curing agent according to the purpose for which the composition of the invention is used. In the step of heat bonding, the thermoplastic resin may be cured completely. Alternatively, it may be provisionally bonded (half-cured) in the heat bonding step and then post-cured by heating in an oven. When a component to which the composition is to be applied is not heat-resistant and cannot be put in an oven, it is possible to prepare two anisotropically conductive compositions, one containing a thermosetting resin base and the other containing a curing agent and a catalyst and coat them in two layers, or separately coat them on facing circuit terminals, and bring the surfaces to be bonded into intimate contact and cure them within a short period of time.

The anisotropically conductive composition of this invention shows excellent properties in a wide range of applications. For example, it can be used as a connector by printing it on one substrate and drying it to an extent perceptible by finger touch. It can also be used to connect circuits with each other and terminals of passive elements (condensers, coils) and active elements (IC, diodes, transistors) of electric component parts.

Or the terminal portion of a tape-like passive or active element may be coated with an ink or varnish of the anisotropically conductive composition and bonded to a print substrate. To connect two bodies electrically and physically, it is possible to use one of two substrates as a hot plate, interposing the anisotropically conductive composition between the hot plate and the other substrate and heat-sealing the two by utilizing the weight of the substrates themselves. Alternatively, heat sealing may be carried out by passing the assembly through hot rolls. The heat source may, for example, be a hot plate kept at a fixed temperature, electric heating, dielectric heating, ultrasonic partial heating, and microwaves. Ultrasonic bonding may also be used.

The anisotropically conductive composition of this invention are useful, for example, for connecting non-solderable conductive films such as Ag resin films, carbon resin films, vapor deposited films and tin oxide films; conductors whose distance is narrow, such as digitizer terminals, indirect volumes, hybrid terminals, chip resistances, tape resistances, condensers and coils; and also for connecting many terminals simultaneously as in key board liquid crystals, digitizers, circuit elements and indirect volumes.

Figure 4:
Figure 4:

When the anisotropically conductive composition of this invention contains the thermosetting resin (resin a) as a binder, the peel strength in the circuit direction and a direction at right angles to the circuit as shown in FIG. 4 increases to 2 or 3 times and the tensile shear srength, heat resistance, moisture resistance and solvent resistance are also greatly improved as compared with an anisotropically conductive composition containing a hot-melt resin or synthetic rubber as the resin (a).

The following examples illustrate the present invention more specifically. All percentages and parts in these examples are by weight unless otherwise specified.

EXAMPLE 1

A hot-melt resin composition of the formulation shown in Table 1 was mixed with 15% of electrically conductive particles of the formulation shown in Table 2 to form an anisotropically conductive composition. The resulting composition was printed to a width of 4 mm and a thickness of 30 micrometers on the terminals of a circuit substrate obtained by screen printing a circuit pattern consisting of 22 conductors each having a width of 0.5 mm and a length of 50 mm with the distance between adjacent conductors being 1.0 mm on a polyester film having a thickness of 50 micrometers by using a carbon resin ink having an area resistance of 20 ohms/□. The printed composition was then dried at 120° C. for 10 minutes.

The printed circuit board based on the above polyester film printed with the anisotropic composition was laid over a printed circuit board obtained by forming the aforesaid circuit pattern by an ordinary etching method on a 0.8 mm thick glass cloth-epoxy resin plate with one surface clad with copper. The wiring positions of the two boards were aligned, and the boards were heat-bonded at 200° C. and 20 kg/cm$^2$ for 5 seconds. The properties of the product are shown in Table 22.

The proportion of particles having a particle diameter of 0.5 micrometer was 4% based on the weight of the entire electrically conductive particles.

TABLE 1

|  | Parts |
| --- | --- |
| Saturated polyester (Vylon 300, Toyobo Co., Ltd.) | 15 |
| Saturated polyester (Stafix LC, Fuji Film Co., Ltd.) | 15 |
| Nylon 12 (Nylon T-450, Daicel Co.) | 70 |
| Acetic acid carbitol | 70 |

TABLE 2

|  | Parts |
| --- | --- |
| Carbon black (Ketjen Black EC, Lion Akzo Co.) | 1 |
| Carbon black (Acetylene Black AB, Denki Kagaku Kogyo K.K.) | 3 |
| Graphite (MARCONITE 5, Marconite Co.) | 96 |

EXAMPLE 2

A circuit pattern consisting of 22 conductors each having a width of 0.5 mm and a length of 50 mm with the distance between adjoining conductors being 1.0 mm was formed by an ordinary etching method on a flexible copper-clad plate based on a polyester film (polyester 50 micrometers, electrolytic copper foil 35 micrometers). An anisotropically conductive composition of the formulation shown in Table 3 was printed on the terminals of the printed circuit board to a width of 3 mm and a thickness of 25 micrometers, and dried at 150° C. for 20 minutes.

The flexible printed circuit board printed with the above anisotropically conductive composition was laid over a printed circuit board obtained by forming the same circuit pattern as above by etching on a 0.8 mm-thick glass cloth-epoxy resin board with one surface clad with copper. The wiring positions of the two boards were aligned, and they were heat-bonded at 190° C. and 30 kg/cm² for 8 seconds. The properties of the product are shown in Table 22.

TABLE 3

|  | Parts |
| --- | --- |
| Titanium nitride (Otsuka Chemical Co.) | 70 |
| Carbon black (EC, Lion Akzo) | 2 |
| Colloidal nickel (300 A, Mitsubishi Kinzoku Co.) | 28 |
| Saturated polyester resin (R-80, Toray Inc.) | 150 |
| Saturated polyester resin (Stafix LC, Fuji Film Co.) | 150 |
| Acetic acid carbitol | 100 |

EXAMPLE 3

Printed circuit boards were heat-bonded at 150° C. and 30 kg/cm² for 90 seconds by the same method as in Example 2 except that an anisotropically conductive composition of the formulation shown in Table 4 was used instead of the composition used in Example 2. The properties of the product are shown in Table 22.

TABLE 4

|  | Parts |
| --- | --- |
| Nickel (#287 Nickel, The International Nickel Co.) | 30 |
| Titanium carbide (TiC-UF, Showa Denko Co.) | 40 |
| Colloidal nickel (300A, Mitsubishi Kinzoku Co.) | 28 |
| Carbon black (EC, Lion Akzo Co.) | 2 |
| Alicyclic epoxy resin (CY-179, Asahi Denka Co.) | 200 |
| Catalyst (700C, Asahi Denka Co.) | 2 |
| Diacetone alcohol | 20 |

EXAMPLE 4

Printed circuit boards were heat-bonded at 150° C. and 30 kg/cm² afor 90 seconds by the same method as in Example 2 except that an anisotropically conductive composition of the formulation shown in Table 5 was used instead of he composition used in Example 2. The properties are shown in Table 22.

TABLE 5

|  | Parts |
| --- | --- |
| 30% gold-plated titanium carbide (Kino Himaku Kenkyusho) | 50 |
| Nickel (Nickel #287, The International Nickel Co.) | 40 |
| Carbon black (EC, Lion Akzo Co.) | 2 |
| Colloidal nickel (300A, Mitsubishi Kinzoku Co.) | 8 |
| Alicyclic epoxy resin (CY-179, Asahi Denka Co.) | 200 |
| Catalyst (700 C, Asahi Denka Co.) | 2 |

TABLE 5-continued

|  | Parts |
| --- | --- |
| Diacetone alcohol | 25 |

COMPARATIVE EXAMPLE 1

Printed circuit boards were heat-bonded at 200° C. and 20 kg/cm² for 5 seconds by the same method as in Example 1 except that nickel powder having an average particle diameter of 2.5 micrometers alone were incorporated as the electrically conductive particles in the amount indicated in Table 6 in the hot-melt resin composition shown in Table 1.

As shown in Table 6, at $10^{10}$ ohms or higher at which insulation between adjacent electrodes was good, the resistance between facing electrodes and its variations were great.

COMPARATIVE EXAMPLE 2

Printed circuit boards were heat-bonded by the same method as in Example 3 except that an anisotropically conductive composition of the formulation shown in Table 7 was used instead of the composition used in Example 3. The resistance between adjacent electrodes was as low as $10^5$ ohms, and insulation betweem them was poor.

TABLE 6

|  | 1 | 2 | 3 | 4 | 5 |
| --- | --- | --- | --- | --- | --- |
| Conductive particles (parts) | 85 | 70 | 50 | 40 | 30 |
| Resin composition (solids, parts) | 15 | 30 | 50 | 60 | 70 |
| Resistance |  |  |  |  |  |
| Between facing electrodes (kilohms) | 2.5–5.5 | 2.2–4.5 | 1.4–25 | 2.2–50 | 2.1–140 |
| Between adjacent electrodes (ohms) | $10^6$ | $10^6$ | $2 \times 10^{10}$ | $10^{12}<$ | $10^{12}<$ |

TABLE 7

|  | Parts |
| --- | --- |
| Nickel (#287 Nickel, The International Nickel Co.) | 25 |
| Colloidal nickel (300A, Mitsubishi Kinzoku Co.) | 60 |
| Carbon black (EC, Lion Akzo Co.) | 15 |
| Alicyclic epoxy resin (CY-179, Asani Denka Co.) | 200 |
| Catalyst (700C, Asahi Denka Co.) | 2 |
| Diacetone alcohol | 25 |

EXAMPLE 5

A thermosetting resin composition of the formulation shown in Table 8 was mixed with 10 to 20% of electrically conductive particles of the formulation shown in Table 9 to prepare an anisotropically conductive composition. A circuit pattern consisting of 22 circuits each having a width of 0.5 mm and a length of 50 mm with the distance between adjacent circuits being 1.0 mm was formed by an ordinary etching method on a flexible copper-clad board based on a polyester film (polyester 50 micromers, electrolytic copper foil 35 micrometers). The above anisotropically conductive composition was printed on the terminals of the circuit board to a width of 5 mm and a thickness of 30 micrometers, and dried at 120° C. for 10 minutes.

The flexible printed circuit board printed with the above anisotropically conductive composition was laid over a printed circuit board obtained by forming the same circuit pattern as above on a 0.8 mm thick glass cloth-epoxy resin board with one surface clad with copper. The wiring positions were aligned, and the two were heat-bonded at 200° C. and 10 kg/cm² for 20 seconds. The properties of the product are shown in Table 10. The properties of the product obtained when the content of the electrically conductive particles was 15% are shown in Table 22. The proportion of particles having a particle diameter of 0.5 micrometer in the entire electrically conductive particles was 16%.

TABLE 8

| | Parts |
|---|---|
| Unsaturated polyester resin (UPICA 8524, Nippon Upica Co.) | 25 |
| Soft unsaturated polyester resin (KC-970, Dainippon Ink and Chemicals Co.) | 25 |
| Diallyl terephthalate monomer | 10 |
| Nylon 12 | 40 |
| Dicumyl peroxide | 3 |
| Acetic acid carbinol | 70 |

TABLE 9

| | Parts |
|---|---|
| Carbon black (Ketjen Black EC, Lion Akzo Co.; to be abbreviated simply EC hereinafter) | 2 |
| Carbon black (Acetylene Black AG, Denki Kagaku Kogyo K.K.; to be abbreviated simply as AB hereinafter) | 4 |
| Colloidal nickel (300A, Mitsubishi Kinzoku Co.) | 10 |
| Nickel (#255 Nickel, The International Nickel Co.) | 84 |

TABLE 10

| | 1 | 2 | 3 |
|---|---|---|---|
| Conductive particles (parts) | 20 | 15 | 10 |
| Resin composition (solids, parts) | 80 | 85 | 90 |
| Resistance (ohms) | | | |
| Between facing electrodes | 0.02 | 0.02 | 0.02 |
| Between adjacent electrodes | $10^{12}$ | $10^{12}<$ | $10^{12}<$ |

EXAMPLE 6

An epoxy resin composition of the formulation shown in Table 11 was mixed with 40 to 60%, based on the resin solids, of electrically conductive particles having the formulation shown in Table 12 to prepare an anisotropically conductive composition. The proportion of particles having a particle diameter of not more than 0.5 micrometer in the conductive particles was 4%.

TABLE 11

| | Parts |
|---|---|
| Epoxy resin (Epototo YD-128, Toto Chemical Co., Ltd.) | 70 |
| Polyamide resin (curing agent) | 30 |
| Nylon 12 (T-450 P-1, Daicel Chemical Co.) | 100 |
| Ethyl Cellosolve | 50 |
| Cyclohexanone | 50 |

TABLE 12

| | Parts |
|---|---|
| Carbon black (EC) | 1 |
| Carbon black (AB) | 3 |
| Nickel (#287 Nickel, The International Nickel Co.) | 36 |
| Nickel (#255 Nickel, The International Nickel Co.) | 60 |

By the same method as in Example 5, printed circuit boards were heat-bonded at 200° C. and 10 kg/cm² for 20 seconds by using the resulting anisotropically conductive composition, and then the resin was post-cured in an oven at 150° C. for 2 hours. The properties of the product are shown in Table 13.

TABLE 13

| | 1 | 2 | 3 |
|---|---|---|---|
| Electrically conductive particles (%) | 60 | 50 | 40 |
| Resin composition (solids, %) | 40 | 50 | 60 |
| Resistance (ohms) | | | |
| Between facing electrodes | 0.03 | 0.03 | 0.1 |
| Between adjacent electrodes | $10^{10}$ | $10^{12}<$ | $10^{12}<$ |

The properties of the product obtained when the content of the electrically conductive particles was 45% are shown in Table 22.

EXAMPLE 7

Printed circuit boards were heat-bonded at 250° C. and 5 kg/cm² for 10 seconds by the same method as in Example 5 except that a phenolic resin composition of the formulation shown in Table 14 and electrically conductive particles of the formulation shown in Table 15 were used. The resin was post-cured at 150° C. for 30 minutes in an oven. The proportion of particles having a particle size of not more than 0.5 micrometer in the entire electrically conductive particles was 16%.

TABLE 14

| | Parts |
|---|---|
| Phenolic resin (Milex RN, Mitsui Toatsu Chemical, Inc.) | 60 |
| Hexamethylenetetramine | 3 |
| Epoxy resin (TEPIC, Nissan Chemical Co., Ltd.) | 37 |
| Ethyl Cellosolve | 30 |
| Cyclohexane | 30 |

TABLE 15

| | Parts |
|---|---|
| Gold-plated nickel (30% gold-plated Ni #287, The International Nickel Co.) | 84 |
| Colloidal nickel (300A, Mitsubishi Kinzoku Co.) | 10 |
| Carbon black (EC) | 2 |
| Carbon black (AB) | 4 |

TABLE 16

|  | 1 | 2 | 3 |
|---|---|---|---|
| Conductive particles (parts) | 50 | 40 | 30 |
| Resin composition (solids, parts) | 50 | 60 | 70 |
| Resistance (ohms) |  |  |  |
| Between facing electrodes | 0.01 | 0.01 | 0.5 |
| Between adjacent electrodes | $10^{12}<$ | $10^{12}<$ | $10^{12}<$ |

The most suitable content of the electrically conductive particles can be set within the range of 40 to 50% as can be seen from Table 16. The properties of the product obtained when the content of the electrically conductive particles was 45% are shown in Table 22.

EXAMPLE 8

A polyurethane resin composition of the formulation shown in Table 17 was used as a binder and mixed with 48% by weight, calculated on the basis of the solids of the resin, of electrically conductive particles of the formulation shown in Table 18 to prepare an anisotropically conductive composition. The proportion of particles having a particle diameter of not more than 0.5 micrometer in the entire electrically conductive particles was 13%.

TABLE 17

|  | Parts |
|---|---|
| Polyester polyol (Desmophene 670, Sumitomo-Bayer Co.) | 60 |
| Aliphatic polyisocyanate (Sumidur N75, Sumitomo-Bayer Co.) | 40 |
| Ethyl Cellosolve | 20 |
| Cyclohexane | 20 |

TABLE 18

|  | Parts |
|---|---|
| Nickel (Ni #287, The International Nickel Co.) | 78 |
| Silica (Aerosil R-972, Nippon Aerosil Co.) | 10 |
| Colloidal titanium (Black Titan, Mitsubishi Kinzoku Co.) | 10 |
| Carbon black (EC) | 2 |

The resulting anisotropically conductive composition was printed to a width of 40 mm on printed circuit boards through a metal mask screen (70 micrometers thick), and dried at 80° C. for 10 minutes to an extent perceptible by finger touching. Then, they were heat-bonded at 150° C. and 3 kg/cm² for 20 seconds. The printed circuit boards had been obtained by printing a circuit pattern consisting of 30 circuits each having a width of 0.1 mm and a length of 60 mm with the distance between circuits being 0.1 mm on a polyester film (75 micrometers thick) by using a silver resin. The silver resin film had a resistance ($R_o$) of 0.05 ohm. After heat bonding, the resistance between facing electrodes was 10 to 15 ohms, and the resistance between adjacent electrodes was more than $10^{12}$ ohms. The resistance to voltage was 100 V. The properties of the product are shown in Table 22.

EXAMPLE 9

Each of the main agent and the primer of a commercially available modified acrylic adhesive (Bond Cony Set G-1, Konishi Co.) was mixed with 48% of electrically conductive particles of the formulation shown in Table 19 to form anisotropically conductive compositions. The proportion of particles having a particle diameter of not more than 0.5 micrometer in the entire electrically conductive particles was 6%.

The primer composition and the main agent composition were printed on the terminals of the same printed circuit boards as used in Example 5 to a width of 5 mm and a thickness of 5 microns (primer) and 100 micrometers (main agent using a metal mask screen), and immediately then, the printed circuit boards were heat-bonded at 50° C. and 2 kg/cm² for 20 seconds. The properties of the product are shown in Table 22.

TABLE 19

|  | Parts |
|---|---|
| Nickel (#287 Nickel, The International Nickel Co.) | 74 |
| Silicon carbide (#8000 SiC, Showa Denko Co., Ltd.) | 20 |
| Carbon black (EC) | 2 |
| Carbon black (AB) | 2 |

EXAMPLE 10

An epoxy resin composition of the formulation shown in Table 20 including a cationic polymerization catalyst (Lewis acid type) was used as a binder and mixed with 45%, calculated on the basis of the resin solids, of electrically conductive particles of the formulation shown in Table 21 to prepare an anisotropically conductive composition. The proportion of particles having a particle diameter of 0.5 micrometer in the entire electrically conductive particles was 20%.

The composition was printed on the same printed circuit boards as used in Example 5 to a width of 5 mm by using a 200-mesh screen having a thickness of 120 micrometers, and dried at 90° C. for 8 minutes to an extent perceptible by finger touch. The boards were then heat bonded at 220° C. and 8 kg/cm² for 10 seconds. The variations in the resistance between facing electrodes was as good as not more than 0.1%. The properties of the product are shown in Table 22.

TABLE 20

|  | Parts |
|---|---|
| Alicyclic epoxy resin (CY-179, Asahi Denka Co.) | 100 |
| Catalyst (700C, Asahi Denka Co.) | 1 |
| Ethyl Cellosolve | 20 |

TABLE 21

|  | Parts |
|---|---|
| Nickel (#287 Nickel, The International Nickel Co.) | 72 |
| Silica (Aerosil R-972, Nippon Aerosil Co.) | 10 |
| Carbon black (EC) | 2 |
| Carbon black (AB) | 6 |
| Colloidal titanium (Black Titan, Mitsubishi Kinzoku Co.) | 10 |

TABLE 22

| | Example | | | | | | | | | |
|---|---|---|---|---|---|---|---|---|---|---|
| | 1 | 2 | 3 | 4 | 5 | 6 | 7 | 8 | 9 | 10 |
| Resistance (ohms) | | | | | | | | | | |
| Between facing electrodes | 19 | 0.6 | 0.3 | 0.01 | 0.02 | 0.05 | 0.01 | 10~15 | 0.04 | 0.03 |
| Between adjacent electrodes | $10^{12}<$ | $10^{12}<$ | $10^{12}<$ | $10^{12}<$ | $10^{12}<$ | $10^{12}<$ | $10^{12}<$ | $10^{12}<$ | $10^{12}<$ | $10^{12}<$ |
| Tensile shear strength (*1) (kg/cm$^2$) | | | | | | | | | | |
| Normal state (20° C.) | 12 | 10 | 50 | 52 | 40 | 55 | 45 | 48 | 65 | 45 |
| Hot state (60° C.) | 6 | 8 | 48 | 50 | 35 | 50 | 42 | 45 | 62 | 40 |
| Hot state (100° C.) | 2 | 3 | 45 | 48 | 30 | 43 | 35 | 40 | 55 | 38 |
| 80° C., 1000 hours | 8 | 9 | 46 | 45 | 40 | 52 | 44 | 46 | 64 | 43 |
| 80° C., 95% RH, 1000 hours | 9 | 8 | 45 | 47 | 45 | 48 | 40 | 43 | 62 | 41 |
| Peel strength (*2) (kg/cm) | | | | | | | | | | |
| Normal state (20° C.) | 0.6 | 0.5 | 1.8 | 1.7 | 0.8 | 1.8 | 1.1 | 1.5 | 1.2 | 1.6 |
| Hot state (60° C.) | 0.4 | 0.4 | 1.6 | 1.5 | 0.7 | 1.6 | 0.9 | 1.2 | 1.1 | 1.4 |
| Hot state (100° C.) | 0.2 | 0.2 | 1.5 | 1.4 | 0.5 | 1.5 | 0.7 | 0.8 | 0.8 | 1.3 |
| 80° C., 1000 hours | 0.5 | 0.4 | 1.6 | 1.6 | 0.8 | 1.7 | 1.0 | 1.5 | 1.2 | 1.6 |
| 80° C., 95% RH, 1000 hours | 0.5 | 0.4 | 1.7 | 1.6 | 0.7 | 1.7 | 0.9 | 1.4 | 1.1 | 1.5 |

(*1) and (*2): A test sample used for the tensile shear is shown in FIG. 4, (I), and a sample used for the peel strength is shown in FIG. 4, (II). The tensile speed was 20 mm/min. for (*1), and 50 mm/min. for (*2).

What is claimed is:

1. An electrically conductive adhesive composition which provides electric conductivity between facing electrodes but maintains electric insulation in the lateral direction across the facing direction, said composition comprising (a) a nonconductive base resin and (b) electrically conductive particles incorporated and dispersed in the resin (a); wherein
   (I) said electrically conductive particles (b) are composed of
      (b-1) 10 to 75%, based on the total weight of the components (a), (b-1) and (b-2), of abrasive grain-like electrically conductive particles having an average particle diameter of at least 1 micrometer, and
      (b-2) 0.2 to 20% by weight, based on the total weight of the components (a), (b-1) and (b-2), of electrically conductive fine particles having an average particle diameter of not more than 0.5 micrometer, and
   (II) said electrically conductive adhesive composition contains a solvent for said base resin (a) in an amount required to form said composition into the state of a printing ink or a paint.

2. The composition of claim 1 wherein the nonconductive base resin (a) is composed of 10 to 50% by weight of a hot-melt adhesive or a thermoplastic resin soluble in said solvent and 0 to 70% by weight of a hot-melt adhesive or thermoplastic resin powder insoluble in said solvent, the proportions of these components being based on the total weight of the resin (a) and the conductive particles (b-1) and (b-2).

3. The composition of claim 1 wherein the nonconductive base resin (a) is composed of 30 to 80% by weight of a thermosetting resin soluble in said solvent or a blend of said thermosetting resin with a thermoplastic resin soluble in said solvent and 0 to 70% by weight of a hot-melt adhesive or thermolplastic resin powder insoluble in said solvent, the proportions of these components being based on the total weight of the resin (a) and the electrically conductive particles (b-1) and (b-2).

4. The composition of claim 1 wherein the abrasive grain-like electrically conductive particles (b-1) are abrasive grain-like electrically conductive particles of a material selected from the group consisting of metals, metal alloys, metal carbides, metal nitrides and metal borides or particles resulting from plating of the surface of these particles or abrasive grain-like metal oxide particles with a highly conductive metal material.

5. The composition of claim 1 wherein the electrically conductive fine particles (b-2) are electrically conductive fine particles of a material selected from the group consisting of carbon black, graphite, highly conductive colloidal metals, and alloys of said metals.

6. The composition of claim 1 wherein the conductive particles (b-1) have an average particle diameter of from 1 to 100 micrometers and an inherent electric resistance at room temperature of from $10^{-5}$ to 100 ohms-cm; and the electrically conductive fine particles (b-2) have an average particle diameter in the range of $10^{-4}$ to 0.5 micrometer and an inherent electric resistance at room temperature of no more than 1 ohm-cm, said fine particles having a generally spherical shape.

7. The composition of claim 1 wherein the electrically conductive particles (b-1) and (b-2) are present at a weight ratio of from 100:1 to 100:70.

8. The composition of claim 1 wherein the electrically conductive particles (b-1) and (b-2) are present at a weight ratio of from 100:3 to 100:45.

9. The composition of claim 1 wherein the solvent is present in an amount of from about 5 to 70% by weight based on the weight of the resin (a).

10. The composition of claim 1 wherein the solvent is present in an amount of from about 8 to about 50% by weight based on the weight of the resin (a).

* * * * *